US005471850A

United States Patent [19]
Cowans

[11] Patent Number: 5,471,850
[45] Date of Patent: Dec. 5, 1995

[54] REFRIGERATION SYSTEM AND METHOD FOR VERY LARGE SCALE INTEGRATED CIRCUITS

[75] Inventor: Kenneth W. Cowans, Fullerton, Calif.

[73] Assignee: Acurex Corporation, Anaheim, Calif.

[21] Appl. No.: 273,378

[22] Filed: Jul. 1, 1994

Related U.S. Application Data

[62] Division of Ser. No. 89,709, Jul. 9, 1993.
[51] Int. Cl.⁶ ................................................. F25B 41/04
[52] U.S. Cl. ...................... 62/223; 62/259.2; 165/80.4; 361/700
[58] Field of Search ................................. 62/259.2, 448, 62/332, 222, 223; 165/80.2, 80.4; 361/700, 688

[56] References Cited

U.S. PATENT DOCUMENTS

| | | | |
|---|---|---|---|
| 2,791,104 | 5/1957 | Duz | 62/222 |
| 3,638,447 | 2/1972 | Abe | 62/222 |
| 4,104,700 | 8/1978 | Hutchison et al. | 361/384 |
| 4,120,021 | 10/1978 | Roush | 361/388 |
| 4,561,040 | 12/1985 | Eastman et al. | 361/385 |
| 4,741,385 | 5/1988 | Bergles et al. | 165/104.29 X |
| 5,052,481 | 10/1991 | Horvath et al. | 165/125 |
| 5,063,475 | 11/1991 | Balan | 165/80.3 X |
| 5,131,859 | 7/1991 | Bowen et al. | 361/382 X |
| 5,150,274 | 9/1992 | Okada et al. | 361/382 |
| 5,168,348 | 12/1992 | Chu et al. | 257/713 |
| 5,168,919 | 12/1992 | Berenholz et al. | 165/80.4 |
| 5,173,838 | 12/1992 | Wessely | 361/386 |
| 5,183,104 | 2/1993 | Novotny | 62/259.2 X |
| 5,220,809 | 6/1993 | Voss | 361/700 |

*Primary Examiner*—William E. Wayner
*Attorney, Agent, or Firm*—Merchant, Gould, Smith, Edell, Welter & Schmidt

[57] ABSTRACT

To dissipate heat generated internally in integrated circuit units, both an active refrigeration system and a passive refrigeration system are coupled to a heat sink that engages the integrated circuit unit. A cold probe insertable into the heat sink has an interior heat exchanger and receives high pressure but ambient temperature refrigerant which is subcooled and expanded to provide cold liquid refrigerant about the interior heat exchanger. As thermal energy from the circuit unit evaporates refrigerant, the refrigerant passes back to a power refrigeration unit for recirculation. A passive backup unit functions if the cold probe operation fails for some reason by boiling off a second refrigerant in a chamber at the heat sink and condensing the gases within a spaced apart air heat exchanger. Refrigerant that recondenses within the air heat exchanger flows by gravity back into the boil off chamber.

24 Claims, 8 Drawing Sheets

REFRIGERATION SYSTEM AND METHOD FOR VERY LARGE SCALE INTEGRATED CIRCUITS

This is a division of application Ser. No. 08/089,709, filed Jul. 9, 1993, pending May 24, 1995.

FIELD OF THE INVENTION

This invention pertains to systems and methods for overcoming the thermal buildup effects in dense circuit components, and more particularly to systems and methods for subcooling of modern high density, large scale integrated circuits.

BACKGROUND OF THE INVENTION

In current large scale integrated circuits, there is a constant effort toward improving operating conditions or parameters, but a number of these improvements tend to conflict with each other. Linewidths and element sizes have constantly been reduced, in order to increase the density so as to make possible new integrated systems of greater versatility, capacity and capability. Such increases in resolution and in the number of circuit elements have, however, concomitantly increased the amount of heat generated internally, which directly impacts upon electron mobility and signal propagation times in the circuit. This not only decreases the data rate capability of the system but tends to introduce timing and other instabilities, which are unacceptable in these systems.

The dense integrated circuits are mounted on circuit boards via which external circuit couplings are made, and the geometry of the circuit packaging must permit access for purposes of servicing, inspection and repair. In order to do this, the circuit boards are often disposed in parallel adjacent planes with small spacings between them. They must also ba plugged in and detached repeatedly, and any associated system must fit within the allotted spaces and also engage in and detach from the active components or subsystems.

To achieve desired performance characteristics, the active elements in dense integrated circuit units are preferably maintained under subcooled conditions, as in the range of −50° C. While this can be done by environmental cooling, that is, reducing the surrounding temperature to a desired level, such level would have to be substantially below −50° C. in order to prevent localized heat buildup at the integrated circuits to a component temperature that is above −50° C. Thus, the technique of cooling a large volume so as to drop the ambient temperature is both too expensive and cumbersome for most applications.

It has been proposed to reduce the cooling load that an ambient system would require by generating a subcooled fluid at a region spaced apart from the circuit units, as by use of a two-stage refrigeration system, and then piping this subcooled fluid to heat sinks in thermal contact with the active circuits. Heat losses can be substantial with this approach and it is necessary to minimize such losses by using state of the art decouplers in the fluid connections. These decouplers require special insulation designs and can only be disconnected and reconnected with care and effort. Furthermore, to reach the needed refrigeration levels such a system requires the use of two different refrigerants and special heat transfer circuits. Because a single refrigeration system may have to cool a number of integrated circuit units, such an arrangement is both costly to build and operate and also of low efficiency.

There is another requirement that complicates the refrigeration problem for integrated circuits. In the event of power or other failure, a backup system should come into operation to allow steady state operation of the integrated circuits at rates slower than the optimum but still acceptable at a temperature level which minimizes thermal buildup above the ambient. Such a support or backup system must itself be automatic and function without independent power for adequately fail-safe operation. The backup system also must fit within the geometry of the circuit boards and not interfere with engagement and disengagement of the boards.

Consequently it is evident that an improved refrigeration system for large scale integrated circuits is needed that is compact, thermally efficient, capable of easy disassembly, and provides an-automatic backup or support capability.

A related but distinct problem is posed by high performance personal computers, which are increasingly of smaller size but higher performance and which have only a convective cooling capability if that. To dissipate increasingly higher wattage heat loads in such systems, there is a need for a smaller high efficiency heat exchange system that can be adjusted to different size and geometry constraints.

SUMMARY OF THE INVENTION

Systems and methods in accordance with the invention employ a primary refrigeration unit spaced apart from the active integrated circuit units and transporting a high pressure, essentially ambient temperature, liquid refrigerant into the immediate vicinity of the circuit units, where a two phase equilibrium is established. Refrigerant in the gas phase is delivered internally to a cold probe in contact with a heat sink that is conductively coupled to an individual circuit unit. Immediately adjacent the heat sink, an internal capillary expander tube within the cold probe delivers the refrigerant in a subcooled condition, and rapid expansion of the refrigerant lowers the temperature further, so that refrigerant in the cold probe can become liquid. The expanded subcooled gases, having absorbed thermal energy via the heat sink, are recirculated back to the active refrigerating system via a subcooler exchanger through which refrigerant passes toward the cold probe system.

An automatic backup refrigeration system also is thermally coupled to the heat sink and comprises a reflux heat exchanger having a refrigerant chamber in thermal contact with the heat sink and heat dissipating vanes which are convectively cooled. The refrigerant in the chamber boils off at above ambient temperature into a high thermal conductivity conduit system thermally coupled to an air heat exchanger defined by the heat dissipating vanes. Condensate forming on the conduit walls recirculates to the boil-off chamber, where heat is again dissipated in returning to the gas phase, thus maintaining the integrated circuit at a level incrementally above the ambient. This passive refrigeration system has separate utility for cooling microprocessor and other chips having high wattage heat generation.

Another aspect of the invention is that a single refrigeration source, arranged in two stages, can be arranged to cool a number of different integrated circuit units, each with its own cold probe and backup refrigeration features. The heat sink for each integrated circuit is configured as a compact heat conductive receiver, with reflux heat exchanger attached. A mating cold probe can thus be inserted from the side into the receiver in a wedging fashion as one unit is moved relative to the other. With adequate compression and condensation capacity in the refrigeration system, a single refrigerant can be pressurized to an adequate level and transferred at ambient temperature along a length of non-critical, easily connected tubing to the cold probe regions. This system delivers sufficient refrigeration capacity to overcome parasitic losses in a multi-chip system and to maintain local temperature levels in the range of −50° C., enabling the integrated circuits to function at significantly higher data rates.

In a more specific example in accordance with the invention, two cascaded refrigeration stages recirculate a single refrigerant that is delivered at high pressure to the cold probe and expanded at a capillary expansion valve in a small volume of the closed end of the cold probe. Expanded gases at ambient or near ambient pressure levels returning from the cold probe are passed in countercurrent heat exchange relationship to incoming refrigerant so as to maximize efficiency. Because refrigerant is pressurized to an appropriate predetermined level but is at near ambient temperature, the refrigerant line need not be insulated and can readily be decoupled. The heat sink, typically is a shaped high thermal conductivity unit against which the probe end is engaged under some pressure to maintain good thermal contact, and is also in thermal conductive relation with the boil-off chamber of the reflux heat exchanger.

The system can incorporate a separate heat sink, subcoolant probe and backup system for each of a number of integrated circuit units, spaced apart in groups on parallel, closely spaced circuit boards, isolated somewhat with insulative material but with air heat exchangers for each heat sink exposed to convective currents. With this arrangement, a number of circuit boards mounting several integrated circuit units each are insertable into parallel positions, where each heat sink engages a different cold probe. A single refrigeration source of adequate capacity feeds each of the separate refrigeration units via line branches. The return gas lines, which are coupled together in the recirculating loop, also need not be insulated and can bedecoupled readily. Because only a single refrigerant need be employed, and because countercurrent heat exchangers are utilized to make most efficient use of thermal energy, the system is superior both in generation and delivery Of refrigeration capacity. The backup system is fully automatic, reliable, and being passive functions indefinitely to prevent excessive heat buildup wherever a problem may arise.

BRIEF DESCRIPTION OF THE DRAWINGS

A better understanding of the invention may be had by reference to the following description, taken in conjunction with the accompanying drawings, in which.

DETAILED DESCRIPTION OF THE INVENTION

Figure 1:
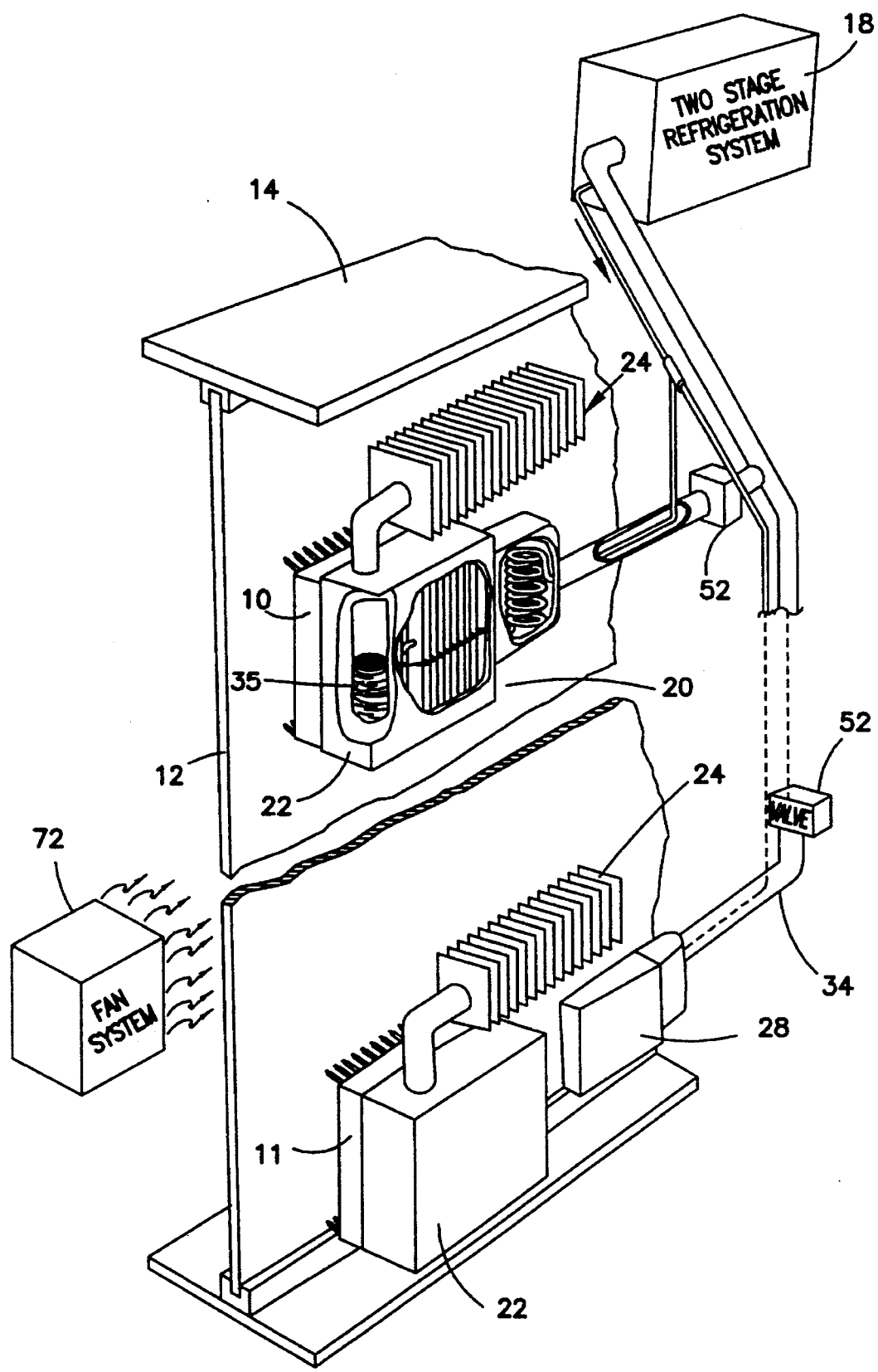
FIG. 1 is a combined perspective and block diagram view, partially broken away, of a system for refrigeration of integrated circuit units, the system having both subcooling capacity and automatic backup.
Figure 2:
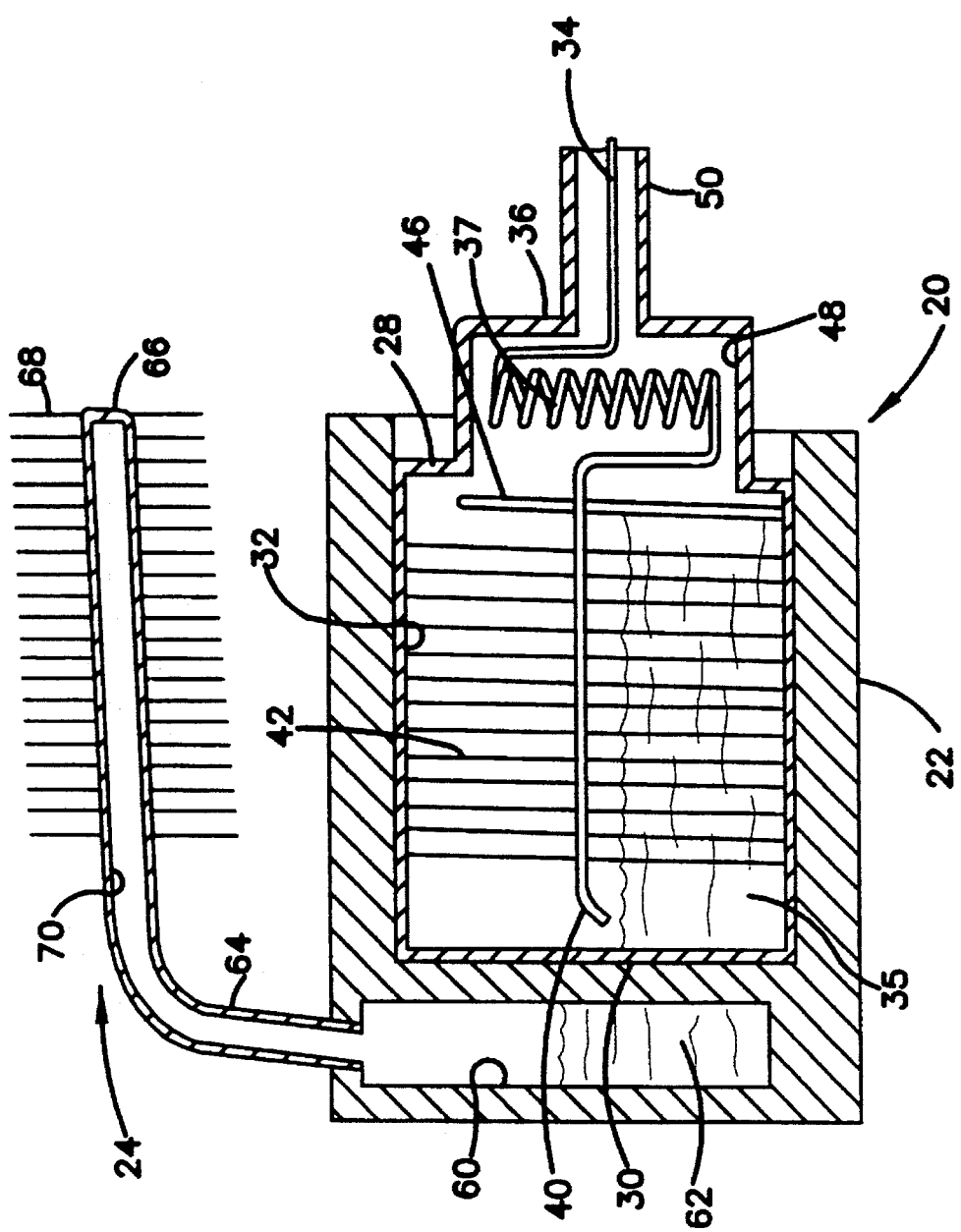
FIG. 2 is a side sectional view of the active refrigeration cold probe and the backup refrigeration system of FIG. 1.
Figure 3:
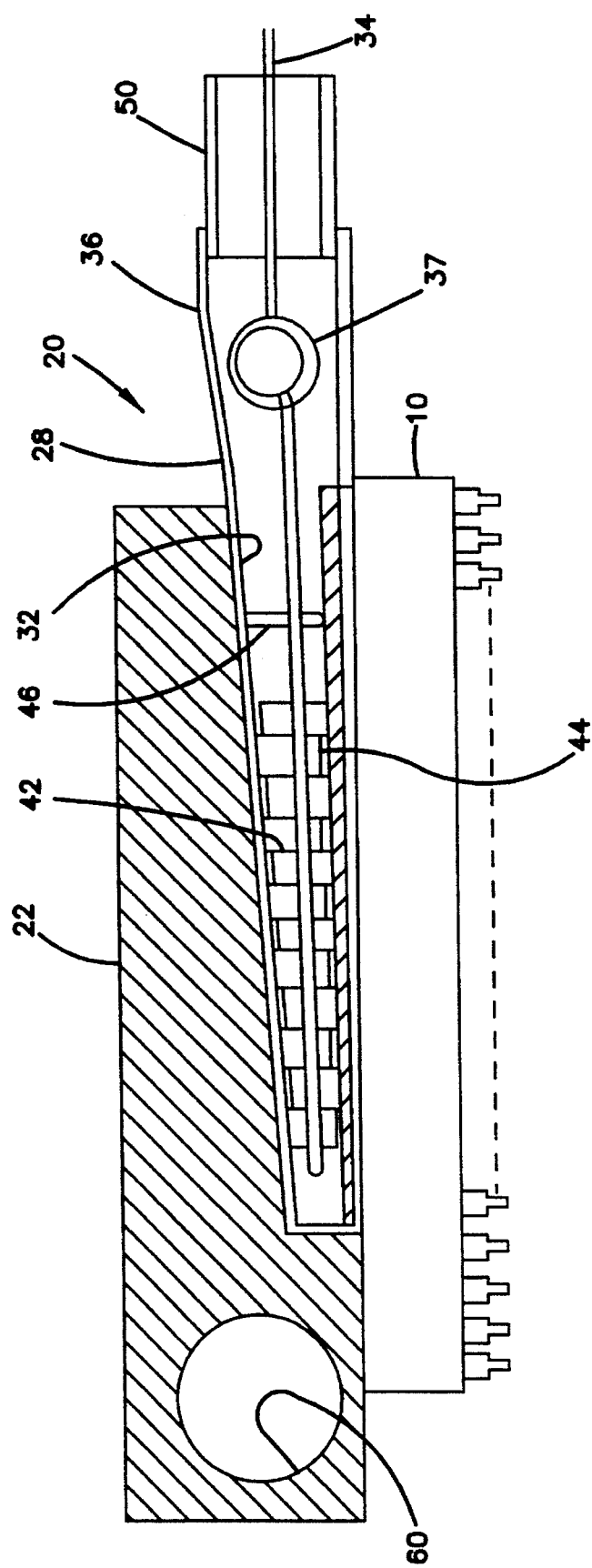
FIG. 3 is a top sectional view of the arrangement of FIG. 2.

Systems and methods in accordance with the invention for providing subcooling refrigeration and automatic backup for high density, high speed-and high capacity integrated circuit units 10, 11 are depicted in FIGS. 1–3, to which reference is now made. Although the system is intended for employment with a plurality of circuit units, for simplicity only two have been depicted in FIGS. 1 and only the elements associated with the first unit 10 are shown in some detail. Insulative structures that may be employed have not been shown for clarity but illustrative examples are provided below. The two circuit units 10, 11 are mounted, spaced apart by some distance, on a single or separate circuit board 12 insertable in a vertical plane within a housing 14, here substantially rectangular. Refrigerant for each of the integrated circuit units 10, 11 (and any others that may be used) is provided from a common refrigeration system. 18, which may hereafter also be referred to as the primary or active system. The common refrigeration system 18 is a two stage compressor-condensation system that feeds pressurized refrigerant such as R-22 to two separate local active subcoolers 20, each of which is in thermal exchange relationship with a different local heat sink 22. The heat sinks 22 are typically monolithic copper units or other material of very high heat conductivity. Care is taken, as by the use of close machining tolerances, brazing or soldering as appropriate, and/or the use of spring or other force to establish solid mechanical contact, to assure efficient thermal interchange. Passive backup refrigeration systems 24 are also thermally coupled to the heat sinks 22, and an air-heat exchanger portion 25 of each backup system 24 extends outside any insulation layer to where it can receive convective air flow.

As seen in FIG. 2 and 3, the local active refrigeration or subcooler system 20 comprises a cold probe 28 in the form of a hollow closed end member, having a wedge shape and a closed end portion 30 nesting within a mating receptacle 32 defined by at least one converging wall in the heat sink 22. A small diameter refrigerant line 34 for pressurized refrigerant 35 is coupled from the primary refrigeration system 18 into the interior of the probe 28. Within the principal body of the probe the line 34 is formed into a subcooler heat exchanger 36 that is here disposed about a central axis shown as a coil 37. The-refrigerant line 34 in the coil 37 is in effect a capillary that has spaces between adjacent turns to allow gas passage, with the coil 37 itself being disposed helically about a central axis in this example. A high surface area of the refrigerant 34 line is thus exposed to passage of returning gases. An orifice at the end of the capillary refrigeration line 34 interior to the cold probe 28 forms a capillary expansion valve 40 in close juxtaposition to the closed end 30 of the probe 28. The capillary expansion valve 40 expels the subcooled refrigerant and the expansion drives the temperature to a level lower than is required for the integrated circuit operating level. The probe 28 has a small interior volume for gas expansion so that the coldest temperature region-is localized and concentrated at the heat sink 22, facilitating removal of thermal energy from the integrated circuit 10. The contact area between the heat sink 22 and the contacting wall of the integrated circuit is adequate for thermal loads including parasitic losses of 65 to 100 watts if the area is 4 cm by 4 cm to 5 cm by 5 cm.

Within the cold probe 28 interior, the subcooled liquid collects about a relatively planar heat exchanger 42 that encompasses the capillary refrigerant line 34 in the expansion volume. Here the heat exchanger 42 is a high surface area corrugated element. Preferably, the heat exchanger 42 is bonded, at the side of the cold probe 28 that is closest the integrated circuit 10 or 11 to a heat conductive planar member, such as a. copper sheet 44 in thermal conductivity relation to the heat sink 22. The capillary refrigerant line 34 passes through the center of the heat exchanger 42 from the coil 37 via a liquid dam 46 which blocks off an entrance orifice 48 into the cold probe 28 that leads to a gas return line 50. The gases boiling off from a liquid refrigerant 51 in the expansion volume pool about the bottom portion of the heat exchanger 42 as thermal energy is extracted from the integrated circuit 10 or 11. Thus flow over the dam 46 and past the subcooler 20 into the return line 50 back toward the primary refrigeration system 18 is substantially blocked. A shut off valve 52 in the return line permits decoupling of the line when desired for replacement or maintenance purposes. Conventional decouplers, suitable for ambient temperature operation, are not shown in the gas return line but may be included.

The passive backup system 24 is thermally coupled to the heat sink 22, and preferably is integral in part with the heat sink 22, as shown in FIGS. 1 to 3. A boiloff chamber 60 within the heat sink 22 is adjacent the closed end of the cold probe 28, and is disposed in communication with a substantially vertical conduit 64, which may be of relatively low thermal conductivity, such as stainless steel. In the boiloff chamber 60, a second refrigerant 62, such as Refrigerant "502," is held in the lower part of the chamber 60 under the normal .low temperature operating conditions maintained by the local subcooler 20. Refrigerant "502," and other conventional refrigerants such as ammonia, have the property of being liquid in a given ambient temperature, but enter the vapor phase at a temperature that is higher by a selectable amount. Refrigerant "502" is currently acceptable under environmental standards but is to be phased out by 1996. It is therefore given as a currently feasible example, but known acceptable alternatives are currently available although they are not yet economically equivalent. The conduit 64 itself is in communication with an air heat exchanger 66 that is spaced apart from the heat sink 22 by a distance, typically several centimeters or more, sufficient to allow vanes 68 on the air heat exchanger 66 to extend into an air convection path within the system geometry. As seen in FIG. 3, the vanes 68 are in direct thermal conductive paths with interior surfaces forming the walls of a condensation chamber 70 that communicates with the conduit 64. The air heat exchanger 66 and the interior condensation chamber 70 are disposed such that condensation on the walls of the chamber 70 returns by gravity through the conduit 64 into the boiloff chamber 60.

Operation of the system FIGS. 1–3 is described in terms of use with two integrated circuit units 10, 11 which dissipate approximately 12.5 watts of electrical energy each. Each also imposes a combined load of about 65 watts given parasitic losses, when the effective operating temperatures of the circuit units 10, 11 are sought to be maintained at regulated levels of approximately −55° C. (−67° F.). The system is arranged, in this example, to provide a heat sink 22 temperature of −63° C. (−82° F.) within a range of less than 1° C. Under these conditions, a state of the art high density microprocessor chip, for example, can run at a data rate 25% or more greater than its nominal operating rate. Such factors are of particular significance in modern multiprocessing systems in which many microprocessors are used, since the increase in data rate equates to a comparable increase in performance with no added microprocessors. The interrelated capability, inherent in the passive backup system 24, of holding the operating temperature at an incremental limit above the ambient level, within a range of 5° to 10° C., is also of material importance to modern systems in a variety of ways. In the multiprocessor context, where multiple microprocessors are densely distributed on closely adjacent circuit boards, total heat generation can provide significant detrimental heat buildup. In newer generations of microprocessors, heat generation in individual chips is already proving to be difficult to overcome. The Intel "Pentium" chip has been determined to draw 13 to 18 watts of power, imposing special requirements on computer installation which use only a single such unit, and greatly increasing the problem of accounting for heat dissipation in multiprocessor installations.

Figure 5:
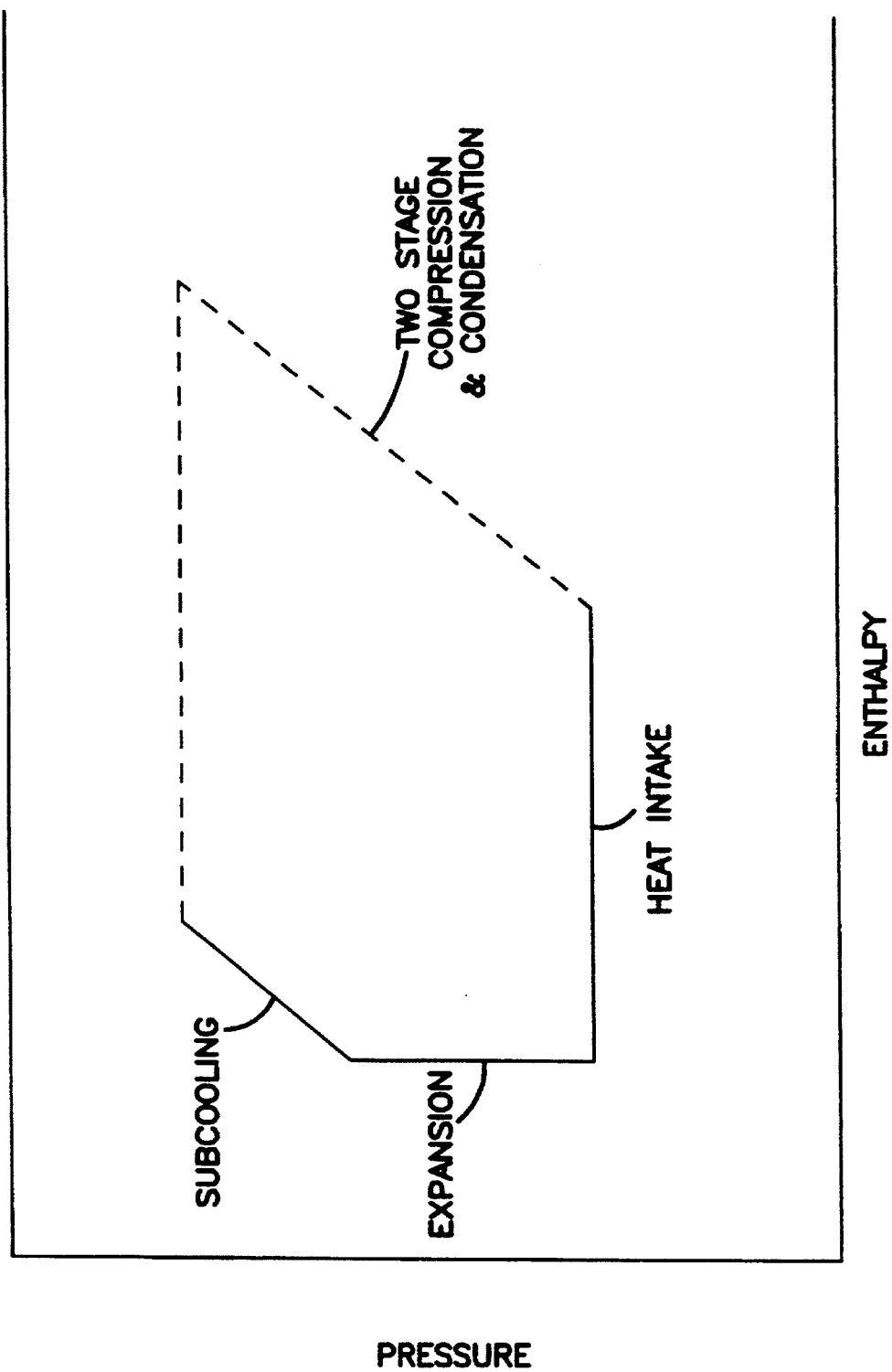
FIG. 5 is a graphical depiction of pressure-enthalpy variations within the recirculating loop of the refrigeration system.

The system of FIGS. 1–3 derives the needed refrigeration capacity for the two integrated circuit units 10, 11, from a two-stage refrigeration system 18 that uses a single refrigerant, such as R22. In the two stages of a typical system 18, such as is described hereafter in conjunction with FIG. 6, the refrigerant is compressed to a high pressure, at substantially ambient temperature. The refrigerant flow is split into separate flow paths formed by the refrigerant lines 34, which need not be insulated inasmuch as the refrigerant is substantially at ambient temperature. As seen in FIG. 5, the two stage compression phase (illustrated generally-and without showing the two separate stages) provides a net compression, here to about 300 psi, at constant entropy and increasing enthalpy. With pressure held constant, condensation in the refrigeration system 18 increases saturation in the gas phase until the refrigerant enters the subcooler 20 prior to the cold probe 28. Here the interchange between the cold boiloff gasses from the cold probe 28 and the incoming gas phase refrigerant substantially reduces the temperature of the refrigerant, as well as its pressure, until the capillary expansion valve 40 is reached, at which point the expanding gases significantly drop in temperature, at constant enthalpy. At the lowest pressure and temperature in the cycle, the gas enters the liquid phase, and liquid surrounds the bottom of the probe heat exchanger 42. The heat exchanger 42 and refrigerant 35 extract heat generated by the circuit unit 10 or 11, and remove it in the gas phase, which increases in enthalpy but maintains constant pressure as boiloff continues.

Thus the small but extremely cold volume established in the cold probe 28 very efficiently conducts heat away from the integrated circuit unit 10 or 11 via the short path through the top surface of the chip, the copper sheet 44 and the cold probe heat exchanger 42. Because the expanded gases are low pressure and approach ambient temperature, they can be returned to the refrigeration unit 18 along parallel lines which combine into a recirculation path. There are numerous additional advantages of this system, including the fact that, with only one refrigeration fluid, the evaporating fluid can be closer in temperature to that of the load, saving at least 10° C. in the temperature reached. Also, in using only one refrigerant, the high pressure gas can be transported to the cold probes at or above ambient temperature. Consequently, uninsulated lines can be used, and tendencies toward frost formation on such lines, which could adversely affect the reliability of the computer circuits on the printed circuit boards and cabling are thereby minimized. The refrigerant lines may also readily be decoupled, whether soldered joints or quick disconnect couplings are used.

The backup system 24 is totally automatic, and requires no separate attention to function in the event of failure of the active refrigeration system. Under normal loading, with the active refrigeration system 18 and cold probe 28 running the refrigerant 62 in the boiloff chamber 60 remains liquid, and there is only of the order of 1 watt heat loss since there is little thermal conductivity through the conduit 64 to the air heat exchanger 66. In the event of a primary system failure, however, boiloff of refrigerant 62 in the chamber 60 commences and the refrigerant gases move into the interior of the condensation chamber 70, where heat is conducted away from the vanes 68 by convective currents, as from a fan 72, shown only schematically. Cooling of the vanes 68 provides surfaces upon which the refrigerant 62 can condense, following which the refrigerant flows back into the boiloff chamber 60 under gravity. Consequently, heat generated at the integrated circuit unit 10 or 11 is transferred to the refrigerant 62, transported into the region of the air/heat exchanger, and given up to the surrounding environment. With a surface area of approximately 300 cm$^2$ at the air heat exchanger 66, the device is capable of maintaining the integrated circuit unit within 35° C. of ambient. Since thermal transfer is unidirectional, and since the only external part is exposed to a small convective cooling device, the backup system 24 can function in a compact high capacity multi-processor system or be utilized with a single microprocessor chip in a micro computer.

Figure 4:
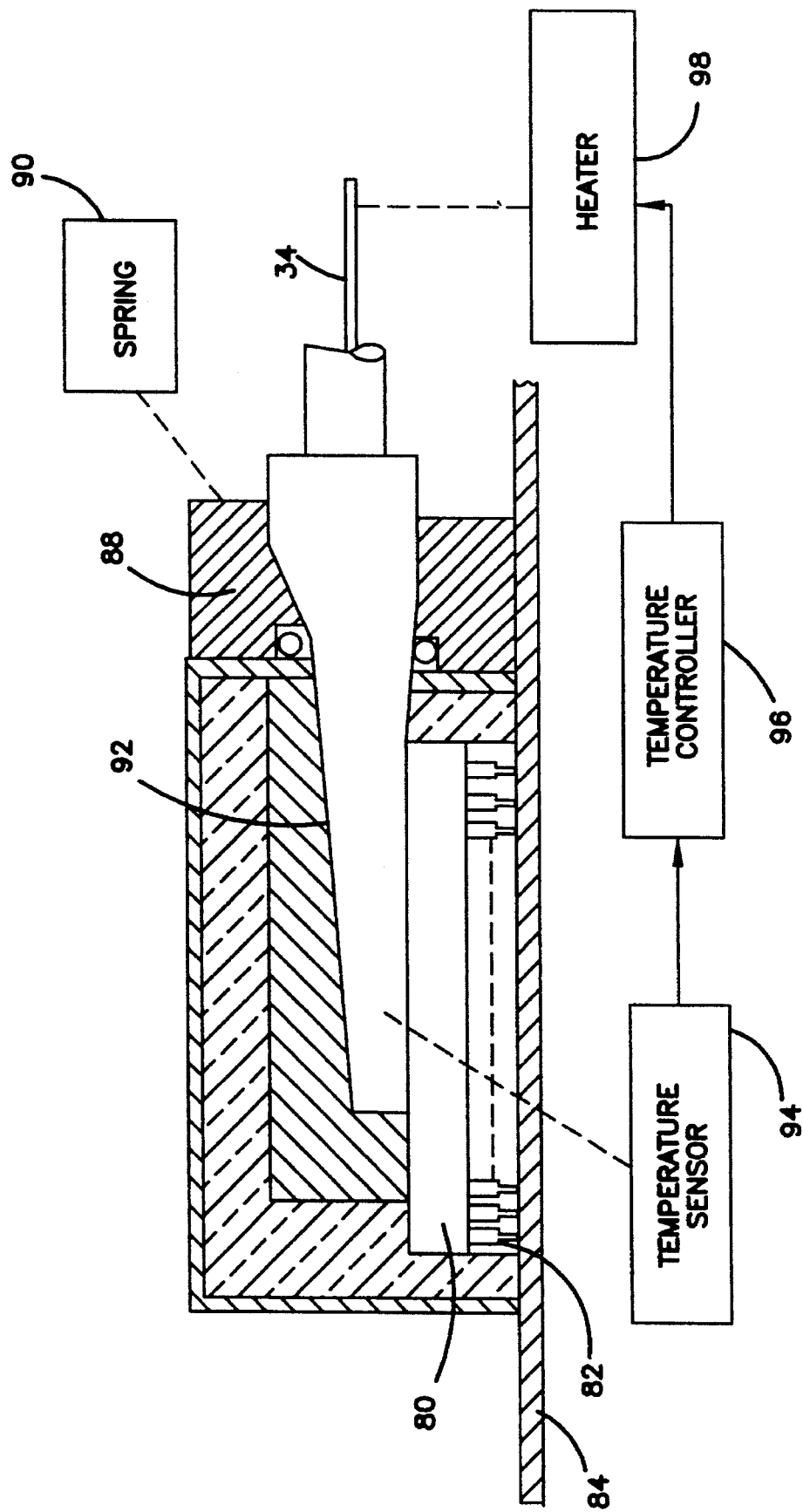
FIG. 4 is a sectional view of a cold probe refrigeration device as disposed in an insulating structure and employing a temperature control.

Further advantageous features of devices and systems in accordance with the invention may comprise the device and circuits of FIG. 4, to which reference is now made. In this example, a high density integrated circuit chip 80 having multiple pins 82 is mounted on a printed circuit board 84 which is inserted in a vertical plane in conventional receptacles (not shown). The integrated circuits may be on a card of the type designated PCMCIA—or "Flashcard" which is insertable in and removable from a housing having external pin connections. The requirement for heat dissipation remains the same as with earlier configurations. Insulation 86 on both sides of the chip 80 and (circuit board 84) and over the heat sink 22, is used to minimize losses. The parasitic losses through the pins 82, the conductive pads on the printed circuit board 84 and through the insulation itself are substantial, and well in excess of the power demand of the integrated circuit chip 80. When the temperature level of the integrated circuit chip 80 is to be maintained at well below ambient, such as the −55° C. previously given these parasitic losses are a dominant factor. For example, with a 12.5 watt load for the chip 80 itself, the parasitic load can bring the total up to the range of 65 watts, which must be accounted for in the refrigeration capacity.

In accordance with the invention, the cold probe 28 may be stationary and mate within the receptacle on the heat sink 22 when the printed circuit board 84 is inserted, or alternatively the printed circuit board may be stationary and the cold probe and associated tubing structure may be insertable into position. The cold probe and tubing system have sufficient rigidity to be received within the cold sink 22 in the first version, which is that actually practiced, but flexible bellows or movable elements may be employed when the cold probe structure as a unit is to be inserted into a stationary heat sink. For better isolation of the ambient temperature portion of the tubing from the cold probe 28, an O-ring flange 88 is coupled between these elements. For best thermal contact, to maintain a force of 1–2 pounds in surface contact between the cold probe 28 and the heat sink, a spring 90, shown only schematically, is attached to the cold probe or to the printed circuit board to maintain the desired tension in the chosen direction. The cold probe is also provided with at least one inclined surface, forming a wedge surface 92 on a broad face so that the mechanical bias can be exerted along the direction of insertion with greater effect.

The capillary expansion valve 40 has not previously been known to be used in this context. An article entitled "Adiabatic Capillary Tube Test Data for HFC—134$a$" by Halim Wijaya of Allied Signal, Inc. shows that it is known to use the function of a capillary tube to meter a refrigerant at a desired flow rate for a given operating condition. The relationship between tube inner diameter, surface roughness, tube length, temperature and flow rate for "subcooling" within a range of 10° to 30° F. were analyzed in this study. The study illustrates that capillary tube functions are well understood in general terms, but it does not teach how to achieve substantially greater cooling differentials, or maintain the precise degree of control that is desirable, or a combination of these.

In accordance with the present invention, however, stability of operation is achieved and very precise control is obtained by a controlled capillary tube configuration. As seen in FIG. 4 a sensor 94 is disposed at the surface of the cold probe 28 in closest relation to the integrated circuit chip 80. A commercially available microprocessor based temperature controller 96, widely employed as a standard controller in industrial devices, controls a heater 98 that is coupled to the capillary tube 34 in its path prior to the cold probe 28. By heating the refrigerant in a manner proportioned to the decrease in flow desired, and conversely by reducing the heating when more flow is desired, precise temperature control (±1° F.) is maintained at the integrated circuit chip 80 over a range of about 22° C. (40° F.) from minus 60° to minus 100° F. Inasmuch as the system can subcool an integrated circuit chip to the desired operating range within about two minutes, and then maintain it precisely thereafter, this provides an important feature for system designers.

Figure 6:
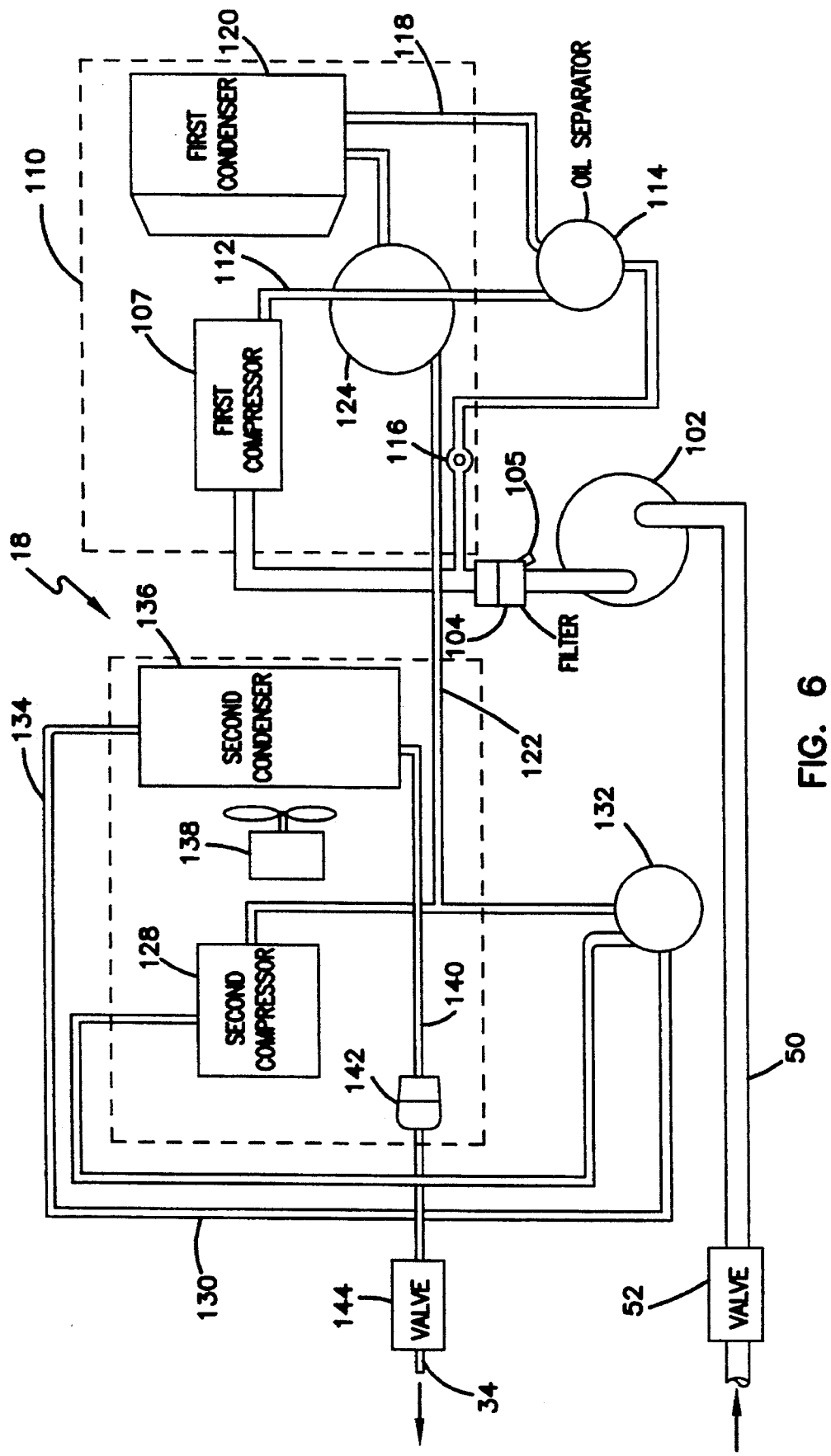
FIG. 6 is a block diagram of a two stage refrigeration system that may be employed in the system of FIG. 1.

An example of a suitable two-stage refrigeration system 18 is shown in FIG. 6, and will be described as used with a system for cooling 16 chips, as described in conjunction with FIG. 8 below. The return line 50 from the cold probe system is passed through the shut-off valve 52 to a suction line accumulator 102, and through a section line filter 104 with a tap 105 to a first compressor 107. The compressor 107 is part of a first stage unit 110, and provides output via a line 112 to an oil separator 114 that is useful in extracting oil to prevent degradation of performance during this low temperature operation. An oil sight glass 116 is in the line from the oil separator 114 to enable a visual check to be made. An output line 118 from the oil separator 114 feeds a first condenser 120 and the output from the first condenser 120 is fed to a discharge line 122 via an accumulator 124 into the second stage 126. There the line 122 feeds into a second compressor 128 and through an output line 130 via a second oil separator 132 along an input line 134 to a second condenser 136. The second condenser 136 is cooled by a fan 138, shown schematically only, and supplies the high pressure, ambient temperature gas on an output line 140 through a filter drier 142 and a shut off valve 144 to the capillary refrigeration line 34.

Figure 7:
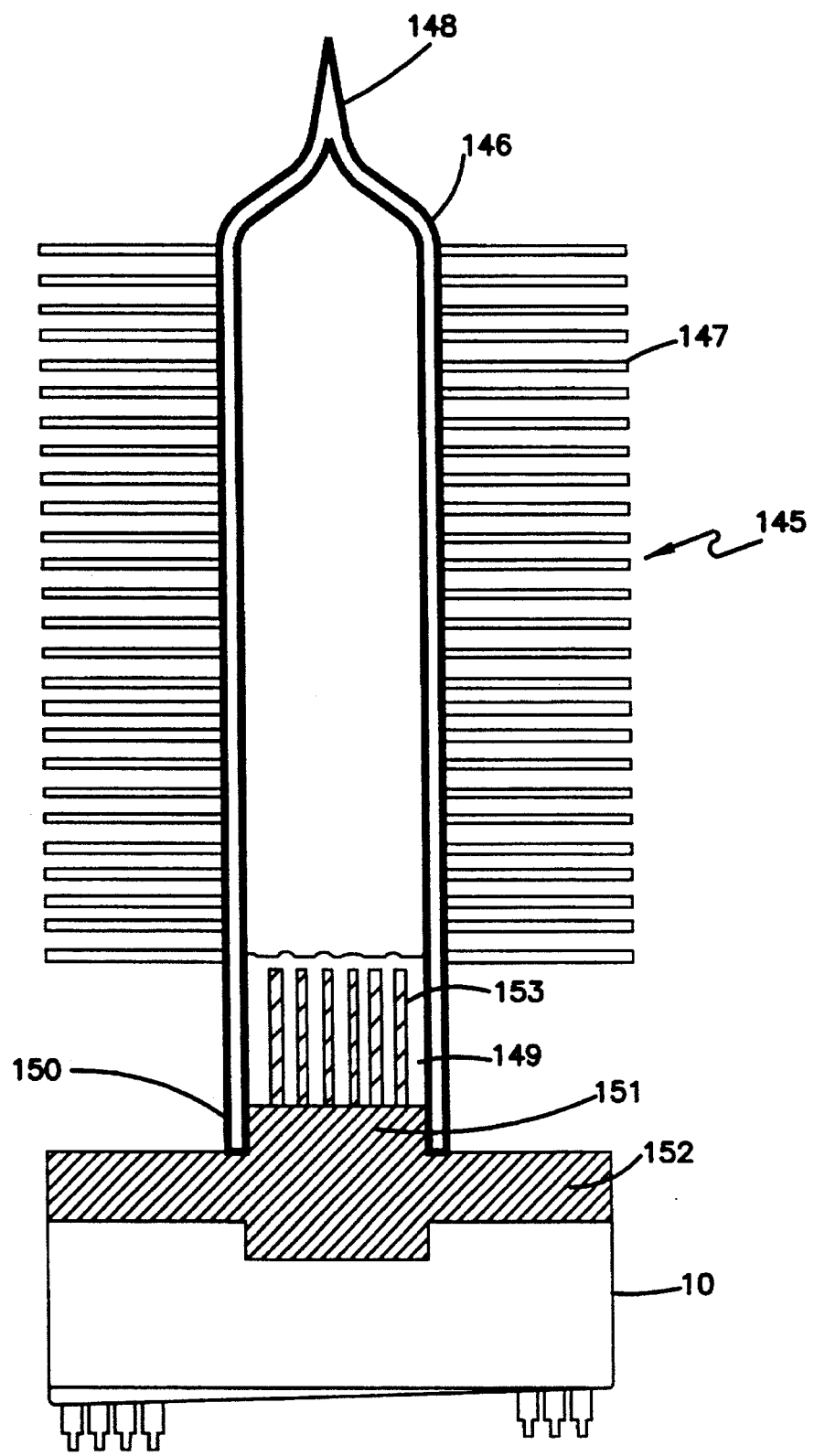
FIG. 7 is a side sectional representation of a different passive backup refrigeration system in accordance with the invention.

For convective cooling of an integrated circuit unit 10, in a PC installation, a reflux heat exchanger 145 as shown in FIG. 7 may advantageously be employed. The air heat exchanger 146 is a Voss-type round cross-section tube having fins 147 and a pinched and sealed end 148 for containing a refrigerant 149 under pressure. The base 150 of the tube is swaged to a square cross-section and joined, as by brazing, to a mating protrusion 151 on a heat sink 152. Fins 153 interior to the tube at the top of the protrusion 151 enhance heat transfer with the refrigerant 149.

This is a high thermal efficiency, low cost design, since the Voss-type tube 146 is a mass produced product which can be trimmed off to a given length, loaded with pressurized refrigerant and sealed. It can also be bent if needed to fit within the volumetric constrains imposed by PC interiors. Because both parts are of high thermal conductivity, and there are high surface areas to contact the liquid and gas phase refrigerant, the system is also able to dissipate generated heat and maintain a given maximum differential with respect to the ambient level.

For extraction of approximately 3500 watts from 16 high performance chips, which allows a significant margin of safety, a five horsepower refrigeration unit 18, having about four horsepower in the first stage 110 and about one horsepower in the second stage 126 is more than sufficient.

Figure 8:
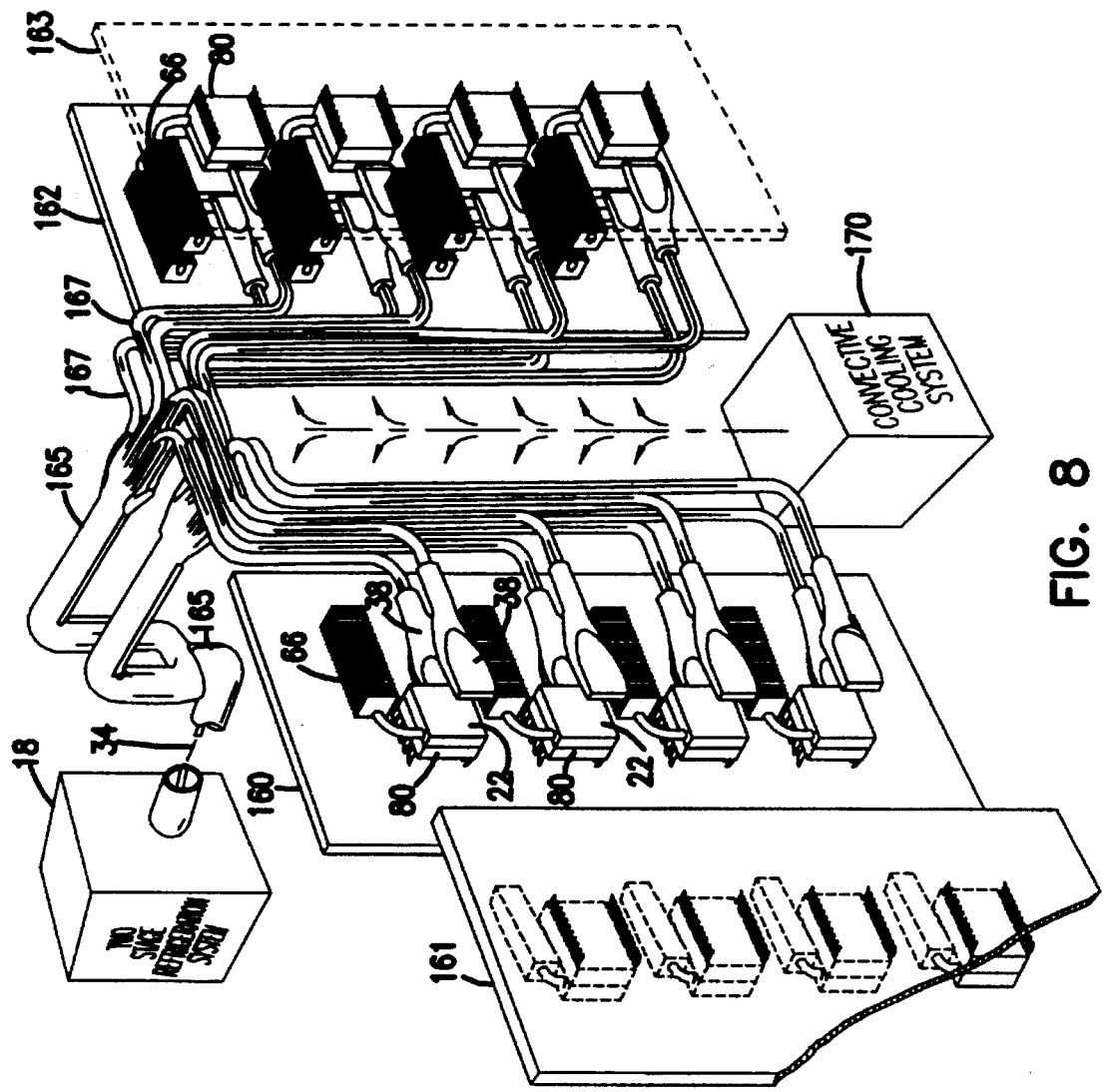
FIG. 8 is a schematic perspective view of a multiple circuit board, multiple-chip computer system using cooling systems and devices in accordance with the invention.

The view of FIG. 8 shows the manner in which multiple high resolution integrated circuit chips densely distributed through a multiprocessor arrangement can be cooled by a single refrigeration unit 18 in accordance with the invention. In this system, 16 chips 80 disposed in sets of four on four different circuit boards 160, 161, 162 and 163 receive refrigerant from and return refrigerant to the refrigeration system 18 on a dual branch mainline on 165, each of which main lines 165 feeds eight branch lines 167. The capillary refrigeration lines 34 are contained within the branch lines 167, and may feed back to the refrigeration system 18 through the return lines or branch off separately after the probe systems. The air heat exchangers 66 from the heat sinks 22, and the cold probes 38 coupled to the branch lines 167 are as previously described in conjunction with FIGS. 1–3. Insulation may be provided on both sides of the boards 160–163, to cover the heat sinks 22 but leave the air heat exchangers 66 exposed. A convective cooling system 170, shown only schematically, is disposed to cool the air heat exchangers 66 with ambient air.

The mechanical rigidity of the main lines 165 and branch lines 167 is sufficient to permit sliding of the circuit boards 160–163 into and out of position without substantial yielding, although-spring tension may thereafter be applied to maintain the desired contact force for thermal conductivity.

The active and passive cooling functions are made possible, in this configuration, because of the very low profile of the active probe systems in relation to the heat sinks, and the integrated arrangement and geometry of the passive backup systems. This is supplemented by the ability of the cold probe and heat sink system to deliver the adequate level of refrigeration capacity, and the automatic thermal transfer characteristics of the backup system.

Although there have been described above and illustrated in the drawings various forms and modifications in accordance with the invention, it will be appreciated that the invention is not limited thereto but encompasses all variations and expedients within the scope of the appended claims.

What is claimed is:

1. A cooling system for subcooling an electronic circuit unit having at least one active component which generates substantial thermal energy during operation, comprising:

a cooler system spaced apart from with the component to be cooled, the cooler system including means for generating a high pressure refrigerant at substantially ambient temperature and refrigerant line means for transporting the refrigerant;

a local cooler including heat sink means in thermal interchange relationship with the component to be cooled, the local cooler comprising high thermal conductivity probe means having an end thermally coupled to the heat sink means, the refrigerant line being disposed within the probe and subcooler heat exchanger means, and the local cooler further including expansion valve means within the probe means adjacent the heat sink means, and means defining a gas return,path for expanded gases from the expansion valve means through the subcooler heat exchanger; and means coupling the gas return path to the cooler assembly for flowing gases back to the cooler assembly.

2. A system as set forth in claim 1 above, wherein the heat sink means includes means foe detachably coupling to the probe means.

3. A system as set forth in claim 2 above, including in addition passive backup refrigeration means comprising a refrigerant vessel in thermal contact with the heat sink, a spaced apart air heat exchanger, and a conduit system communicating between the refrigerant vessel and in thermal interchange relation with the air heat exchanger, the backup refrigeration means including a refrigerant that boils off below at approximately ambient temperature and condenses in the conduit system to provide backup cooling capacity in the event of failure of the cooler system.

4. The invention as set forth in claim 3 above, wherein the cooler system comprises a pair of serially coupled compressors each including air cooled heat exchanger means, and wherein the refrigerant comprises a single refrigerant.

5. The invention as set forth in claim 4 above, wherein the high conductivity probe comprises a thermally conductive hollow wedge member having a closed end, the heat sink being intimately disposed about the closed end of the member with a contact force in excess of about one pound, wherein the subcooler heat exchanger means is formed as a coil in the path of the returning gases, and wherein the refrigerant line includes a terminating capillary expansion valve.

6. A system as set forth in claim 5 above, wherein the circuit unit to be cooled comprises a high density integrated circuit unit in thermal contact with the heat sink and a circuit board coupled thereto, and wherein the system further includes insulation means about the refrigerant vessel and the local cooler, and a relatively low thermal conductivity housing about the insulation means.

7. A system as set foroth in claim 6 above, wherein the gas return means and refrigerant lines each include means for decoupling the local cooler from the cooler system.

8. A capillary tube refrigerant expander system for control extraction of heat from an active thermal energy generator comprising:

cold probe means in thermal contact with the active thermal energy generator and maintaining a first pressure range therein;

capillary tube means coupled to receive a refrigerant at a pressure substantially higher than the first pressure range, the capillary tube means including capillary outlet means within the cold probe means for rapid expansion of refrigerant at the first pressure range to effect cooling of the cold probe means;

means coupled to the cold probe means for sensing the temperature thereof; and means responsive to the sensed temperature for controlling the temperature of the refrigerant before rapid expansion thereof.

9. A system as set forth in claim 8, wherein the means for controlling the temperature comprises an electronic controller responsive to the sense temperature, and heater means coupled to the capillary tube means prior to the cold probe means for controlling the temperature of the refrigerant in the capillary tube means.

10. A system for maintaining the temperature level of an integrated circuit unit within a nominal low temperature range such that the circuit unit can operate at higher data transfer rates, comprising:

a high thermal conductivity heat sink structure thermally coupled to the circuit unit;

cold probe means thermally coupled to the heat sink, the cold probe means including internal capillary refrigerant expansion means adjacent the heat sink structure and return flow tubing means;

active refrigeration means coupled to supply pressurized refrigerant to the refrigerant expansion; and passive refrigeration means coupled to the heat sink structure and comprising air cooled heat exchanger means and two phase gas circulation means for passively absorbing thermal energy from the circuit unit when the cold probe means does not maintain a desired operating range of temperature.

11. The method of subcooling an integrated circuit unit having substantial internal heat buildup to a level of the order of −50° C. with a single refrigerant comprising the steps of:

actively pressurizing a first refrigerant in a gaseous state while maintaining an ambient temperature therein;

expanding the refrigerant in the gaseous state to lower the temperature and pressure thereof adjacent the circuit unit until a liquid state is reached;

extracting thermal energy from the integrated circuit unit with the liquid refrigerant until a gaseous state is reached;

passing the first refrigerant after expansion in thermal relation to the first refrigerant before expansion to lower the temperature thereof;

maintaining a second liquid refrigerant in thermal relation to the circuit unit, the evaporation temperature of the second refrigerant being in the ambient range of temperatures;

extracting thermal energy from gases evaporated from the second liquid refrigerant; and dissipating thermal-energy from the circuit unit with the second refrigerant when the ambient temperature range is reached due to failure of refrigeration with the first refrigerant.

12. A system for cooling at least two high density electronic circuit subsystems to substantially below ambient temperature while absorbing internal thermal energy generated by the subsystems comprising:

refrigeration means providing a flow of high pressure refrigerant;

an active separate thermal energy exchange system for each subsystem, comprising thermally conductive heat sink means coupled to the subsystem and thermal transfer chamber means in thermal exchange relationship with the heat sink means;

means within the chamber means for expanding the high pressure refrigerant to a subcooled state in proximity to the heat sink means, and means defining a gas return path from the means for expanding to the refrigeration means; and a separate backup passive refrigeration system adjacent each heat sink means and comprising a refrigerant chamber in close thermal relation to the heat sink means and a second refrigerant therein that evaporates in the ambient temperature range, a gas distribution system receiving the evaporated refrigerant, and an air heat exchanger spaced apart from the active thermal energy exchange system, and thermally coupled to the gas distribution system for recondensation of the second refrigerant.

13. A cold probe device for insertion into a receptacle of a heat sink for refrigeration of a thermally coupled active electronic circuit device, comprising:

a thermally conductive housing for insertion in substantially mating relation into the heat sink receptacle, the housing having broad vertical sides and narrow vertical and horizontal edges and an open interior, and an inlet opening at an intermediate region of one of the vertical edges;

heat exchanger means within the interior of the housing and distributed through a substantial majority of the volume thereof, the heat exchanger means being thermally coupled to at least one broad side of the housing;

capillary means extending throughout the inlet opening in the heat exchanger means and having an outlet for providing a pressurized refrigerant within the housing; and conduit means communicating with the interior of the housing via the inlet opening for providing an outlet flow path for gas phase refrigerant.

14. A device as set forth in claim 13 above, wherein one narrow vertical edge of the housing comprises a closed end, wherein the capillary means outlet is disposed adjacent the closed end edge, wherein the capillary means further is disposed within the conduit means at the inlet opening to the housing, and wherein the device further includes a liquid dam within the housing adjacent to but spaced apart from the inlet opening and extending to a height greater than the inlet opening.

15. A device as set forth in claim 14 above, wherein the housing includes tapered surface means engagable to the heat sink receptacle for providing a conductive thermal path to the active circuit device.

16. A device as set forth in claim 15 above, wherein the tapered surface means provides a wedge surface, and wherein the heat exchanger means includes planar heat conductive means coupled to one side thereof adjacent the active electronic circuit device and in thermal contact therewith, and the device further includes means for biasing the housing in the direction toward the heat sink with mechanical force sufficient to maintain good thermal exchange contact.

17. A device as set forth in claim 15 above, wherein the heat exchanger as a sinuous high surface area and is a high thermal conductivity element.

18. A device as forth in claim 13 above, further including means within the housing for sensing the temperature at the heat exchanger means, and means responsive to the sensed temperature for controlling the temperature of the pressurized refrigerant.

19. A device as set forth in claim 18 wherein the means for controlling the temperature comprises heater means disposed adjacent the capillary means, and controller means responsive to the sense temperature for increasing the temperature of the heater means when the flow of refrigerant is to be reduced.

20. A device set forth in claim 13 above, and including in addition subcooler heat exchanger means disposed in the path of the capillary means prior to the heat exchanger means and interacting with the return gas phase refrigerant to subcool pressurized refrigerant in the capillary means prior to the capillary means at the heat exchanger means.

21. A device as set forth in claim 20 above, wherein the subcooler means comprises a high surface area multiple coil formed of the capillary means in the conduit means.

22. A system for extraction of heat energy from separate active high density integrated circuit modules mounted on a printed circuit board slidable into an engagement position in a circuit counsel, comprising:

separate heat sink means thermally coupled to each of the separate circuit units, each of the heat sink means including a side receptacle on the entry side of the printed circuit board;

a number of cold probe means, each configured and positioned to fit into the side aperture of a different heat sink means when the printed circuit board is slid into engagement position;

a refrigeration system providing pressurized refrigerant to each of the cold probe means; and means for recirculating refrigerant from the cold probe means to the refrigeration system, the refrigerant having received thermal energy from the associated high density integrated circuit and convecting to energy to a low pressure gas phase therein.

23. A system as set forth in claim 22, wherein each of the cold probe means includes means for separately controlling the temperature of the associated integrated circuit.

24. A system as set forth in claim 23 above, wherein the system further includes capillary expansion valve means within the cold probe means for lowering the temperature of the refrigerant, and means adjacent the cold probe means and in the return path of the refrigerant for subcooling the incoming refrigerant with the exiting refrigerant.

* * * * *